United States Patent
Hooper et al.

(10) Patent No.: US 7,417,258 B2
(45) Date of Patent: Aug. 26, 2008

(54) SEMICONDUCTOR LIGHT-EMITTING DEVICE, AND A METHOD OF MANUFACTURE OF A SEMICONDUCTOR DEVICE

(75) Inventors: Stewart Edward Hooper, Oxford (GB); Valerie Bousquet, Oxford (GB); Jonathan Heffernan, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 117 days.

(21) Appl. No.: 11/380,440

(22) Filed: Apr. 27, 2006

(65) Prior Publication Data

US 2006/0244002 A1 Nov. 2, 2006

(30) Foreign Application Priority Data

Apr. 28, 2005 (GB) ................ 0508556.8
Apr. 28, 2005 (GB) ................ 0508557.6

(51) Int. Cl.
*H01L 27/15* (2006.01)
(52) U.S. Cl. ............................................. 257/86
(58) Field of Classification Search .............. 257/13, 257/79, 86–95; 438/22–32
See application file for complete search history.

(56) References Cited

U.S. PATENT DOCUMENTS

| | | | |
|---|---|---|---|
| 5,777,350 | A | 7/1998 | Nakamura et al. |
| 6,515,313 | B1 | 2/2003 | Ibbetson et al. |
| 6,541,797 | B1 * | 4/2003 | Udagawa ............ 257/94 |
| 6,614,060 | B1 | 9/2003 | Wang et al. |
| 2003/0173578 | A1 | 9/2003 | Schaff et al. |
| 2003/0232457 | A1 | 12/2003 | Kawaguchi et al. |
| 2005/0116215 | A1 | 6/2005 | Hooper et al. |

FOREIGN PATENT DOCUMENTS

CN 1316782 10/2001

(Continued)

OTHER PUBLICATIONS

K. Jeganathan et al.; "Two-dimensional eletron gases induced by polarization charges in AlN/GaN heterostructure grown by plasma-assisted molecular-beam epitaxy"; Journal of Applied Physics; vol. 94, No. 5; Sep. 1, 2003; pp. 3260-3263.

(Continued)

*Primary Examiner*—Calvin Lee
(74) *Attorney, Agent, or Firm*—Renner, Otto, Boisselle & Sklar, LLP

(57) ABSTRACT

A method of manufacturing a nitride semiconductor device comprises the steps of: growing an $In_xGa_{1-x}N$ ($0 \leq x \leq 1$) layer, and growing an aluminium-containing nitride semiconductor layer over the $In_xGa_{1-x}N$ layer at a growth temperature of at least 500° C. so as to form an electron gas region at an interface between the $In_xGa_{1-x}N$ layer and the nitride semiconductor layer. The nitride semiconductor layer is then annealed at a temperature of at least 800° C. The method of the invention can provide an electron gas having a sheet carrier density of $6 \times 10^{13} cm^{-2}$ or greater. An electron gas with such a high sheet carrier concentration can be obtained with an aluminium-containing nitride semiconductor layer having a relatively low aluminium concentration, such as an aluminium mole fraction of 0.3 or below, and without the need to dope the aluminium-containing nitride semiconductor layer or the $In_xGa_{1-x}N$ layer.

16 Claims, 5 Drawing Sheets

FOREIGN PATENT DOCUMENTS

| | | |
|---|---|---|
| JP | 2002-270892 | 9/2002 |
| JP | 2004-080047 | 3/2004 |
| WO | 03/032397 A3 | 4/2003 |
| WO | 2004/061923 A1 | 7/2004 |
| WO | 2004/107406 | 12/2004 |

OTHER PUBLICATIONS

K. C. Kim et al.; "Influence of Electron Tunneling Barriers on the Performance of InGaN-GaN Ultraviolet Light-Emitting Diodes"; phys. stat. sol.; (a)201; No. 12; 2004; pp. 2663-2667.

I.P. Smorchkova et al.; "Polarization-induced charge and electron mobility in AlGaN/GaN heterostructures grown by plasma-assisted molecular-beam epitaxy"; Journal of Applied Physics; vol. 86; No. 8; Oct. 15, 1999; pp. 4520-4526.

Y.H. Luo et al.; "Photoluminescence of InAs Quantum Dots Coupled to a Two-dimensional Electron Gas"; Journal of Electronic Materials; vol. 30; No. 5; 2001; pp. 459-462.

Debdeep Jena et al.; "Realization of wide electron slabs by polarization bulk doping in graded III-V nitride semiconductor alloys"; Applied Physics Letters; vol. 81; No. 23; Dec. 2, 2002; pp. 4395-4397.

J.P. Ibbetson et al.; "Polarization effects, surface states, and the source of eleron electrons in AlGaN/GaN heterostructure field effect transistors"; Applied Physics Letters; vol. 77; No. 2; Jul. 10, 2000; pp. 250-252.

K.A. Mkhoyan et al.; "Formation of a quasi-two-dimensional electron gas in GaN/$Al_xGa_{1-x}$N heterostructures with diffuse interfaces"; Journal of Applied Physics; vol. 95; No. 4; Feb. 15, 2004; pp. 1843-1848.

Narihiko Maeda et al.; "High-temperature electron transport properties in AiGaN/GaN heterostructures"; Applied Physics Letters; vol. 79; No. 11; Sep. 10, 2001; pp. 1634-1636.

Great Britain Search report for corresponding Application No. 0508556.8 dated Aug. 16, 2005.

Great Britain Search report for corresponding Application No. 0508557.6 dated Aug. 17, 2005.

Ho Won Jang et al., "Mechanism of Two-Dimensional Electron Gas Fornation in $Al_xGa_{1-x}$N/Gan Heterostructures"; Applied Physics Letters; vol. 81, No. 7; Aug. 12, 2002; pp. 1249-1251.

* cited by examiner

- 9: Mg doped GaN (300nm thick)
- 8: Mg doped AlGaN (0.5 μm thick)
- 7: Mg doped GaN (100nm thick)
- 6: Mg doped AlGaN (5nm thick)
- 5: InGaN
- 4: Si doped GaN (100nm thick)
- 3: Si doped AlGaN (0.5 μm thick)
- 2: Si doped GaN (4 μm thick)
- 1: SAPPHIRE (0001) SUBSTRATE

13: ELECTRON GAS REGION
ACTIVE REGION 10

US 7,417,258 B2

SEMICONDUCTOR LIGHT-EMITTING DEVICE, AND A METHOD OF MANUFACTURE OF A SEMICONDUCTOR DEVICE

This nonprovisional application claims priority under 35 U.S.C. § 119(a) on Patent Applications No. 0508557.6 and No. 0508556.8, both filed in the U.K. on Apr. 28, 2005, the entire contents of which are hereby incorporated by reference.

FIELD OF THE INVENTION

The present invention relates to a semiconductor light-emitting device, and in particular to a semiconductor light-emitting device fabricated in a nitride materials system such as, for example, the (Al,Ga,In)N materials system. The present invention also relates to a method of manufacture of a semiconductor device, and in particular to manufacture of a semiconductor device in a nitride materials system such as, for example, the (Al,Ga,In)N materials system. The invention may be applied to, for example, a light-emitting diode (LED) or to a laser diode (LD), or to manufacture of an optical semiconductor device such as a light-emitting diode (LED) or a laser diode (LD). The invention may also be applied to manufacture of a electronic semiconductor device such as a heterostructure field effect transistors (HFET) or a high electron mobility transistors (HEMT).

BACKGROUND OF THE INVENTION

The (Al,Ga,In)N material system includes materials having the general formula $Al_xGa_yIn_{1-x-y}N$ where $0 \leq x \leq 1$ and $0 \leq y \leq 1$. In this application, a member of the (Al,Ga,In)N material system that has non-zero mole fractions of aluminium, gallium and indium will be referred to as AlGaInN, a member that has a zero aluminium mole fraction but that has non-zero mole fractions of gallium and indium will be referred to as InGaN, a member that has a zero indium mole fraction but that has non-zero mole fractions of gallium and aluminium will be referred to as AlGaN, and so on. There is currently considerable interest in fabricating semiconductor light-emitting devices in the (Al,Ga,In)N material system since devices fabricated in this system can emit light in the blue wavelength range of the spectrum. Semiconductor light-emitting devices fabricated in the (Al,Ga,In)N material system are described in, for example, U.S. Pat. No. 5,777,350. There is also interest in fabrication electronic devices, such as high-performance transistors, in the (Al,Ga,In)N material system.

FIG. 1 is a schematic view of a typical semiconductor laser device (or laser diode—"LD") 10 fabricated in the (Al,Ga,In)N material system. The device is able to emit light in the blue wavelength range.

The laser device 10 of FIG. 1 is grown over a substrate 1. In the laser diode 10 of FIG. 1 the substrate 1 is a sapphire substrate.

A buffer layer 2, a first cladding layer 3 and a first optical guiding layer 4 are grown, in this order, over the substrate 1. In the embodiment of FIG. 1 the buffer layer 2 is a n-type GaN layer, the first cladding layer 3 is an n-type AlGaN layer, and the first optical guiding layer 4 is an n-type GaN layer.

An active region 5 is grown over the first optical guiding layer 4.

A second optical guiding layer 7, a second cladding layer 8 and a cap layer 9 are grown, in this order, over the active region 5. The second optical guiding layer 7 and second cladding layer 8 are of opposite conductivity type to the first optical guiding layer 4 and first cladding layer 3; in the laser device 10 of FIG. 1 the first optical guiding layer 4 and first cladding layer 3 are n-type so the second optical guiding layer 7 and second cladding layer 8 are p-type layers. In the laser device of FIG. 1 the second optical guiding layer 7 is a p-type GaN layer, the second cladding layer 8 is a p-type AlGaN layer, and the cap layer 9 is a p-type GaN layer.

The structure of the active region 5 of the laser device 10 is not shown in detail in FIG. 1. In general, however, the active region 5 will be either a single quantum well (SQW) active region having one quantum well layer disposed between first and second barrier layers, or a multiple quantum well (MQW) active region having two or more quantum well layers with each quantum well layer being disposed between two barrier layers. The quantum well layer(s) may be, for example, layers of InGaN, AlGaN or AlGaInN.

High quality heterostructure field effect transistors (HFET) and high electron mobility transistors (HEMT) typically require a combination of large electron sheet densities and high electron mobilities in the channel region. One approach to obtaining the necessary electron sheet concentration and electron mobility is to incorporate an electron gas region into the device. Electrons in an electron gas can have a much higher mobility than those in a bulk semiconductor crystal as a result of fewer interactions (or scattering) with host or dopant atoms.

It may also be desirable to incorporate an electron gas region into a nitride semiconductor optoelectronic device, as is described below.

As is known, an electron gas region may consist of, for example, a potential well in which electrons can accumulate to form an electron gas. Depending on the shape and thickness of the potential well, the electrons in the electron gas may be confined in the direction perpendicular to the plane of the quantum well and may be free to move only in the two dimensions parallel to the plane of the quantum well; in this case, the electron gas is known as "a two-dimensional electron gas" (2DEG). Alternatively, the electrons of the electron gas may be free to move in all three dimensions in which case the electron gas is known as "a three-dimensional electron gas" (3DEG). Electrons in an electron gas can have a much higher mobility than those in a bulk semiconductor crystal as a result of fewer interactions (or scattering) with host or dopant atoms.

Jeganathan et al. have reported, in J. Appl. Phys. 94 (2003) p 3260, that an AlGaN/GaN heterostructure can be used to achieve a 2DEG with a sheet carrier concentration of up to $5 \times 10^{13}$ cm$^{-2}$ without intentional doping of the heterostructure. This is well in excess of the sheet carrier concentration achievable in other III-V systems such as the AlGaAs/GaAs system, and this is mainly due to the five-times larger piezoelectric polarisation of a strained AlGaN layer compared to AlGaAs and the very large spontaneous polarisation (polarisation at zero strain) in wurtzite III-nitrides compared to other III-V materials. However, the method of Jeganathan et al. requires the use of an AlGaN layer that has a very high aluminium mole fraction, possibly even use of an AlN layer, in order to obtain a 2DEG having a sheet carrier concentration of $5 \times 10^{13}$ cm$^{-2}$. It is generally undesirable to incorporate a layer of AlN or AlGaN with a high aluminium mole fraction into a device, since this can lead to excessive strain within the device, to the formation of dislocations, and to unwanted impurity incorporation.

Co-pending U.S. patent application Ser. No. 10/974,348 (Co-pending UK patent application No. 0325100.6) discloses a semiconductor light-emitting device fabricated in a nitride material system and having an active region disposed over a substrate. The active region comprises a first aluminium-containing layer (for example an AlGaN layer) forming the lowermost layer of the active region, a second aluminium-containing layer forming the uppermost layer of the active region, and at least one InGaN quantum well layer disposed between the first aluminium-containing layer and the second aluminium-containing layer.

Jena et al. report, in Appl. Phys. Lett. 81(23) 2002 p 4395, the use of AlGaN layers with a graded aluminium mole fraction to produce a 3-D electron gas or slab. This method produces an electron gas having a maximum sheet electron concentration of $9 \times 10^{12}$ cm$^{-2}$.

Ibbetson et al. discuss, in Appl. Phys. Lett. 77(2) 2000 p 250, the source of electrons in an electron gas at an AlGaN/GaN interface. They identify surface states as major source of electrons and predict a maximum sheet electron concentration of $4.8 \times 10^{13}$ cm$^{-2}$ for an electron gas at an AlGaN/GaN interface. They make no mention of how to form the surface states.

Mkhovan et al. describe, in J. Appl. Phys. 95(4) 2004, p 1843, the formation of a quasi-2DEG with an electron sheet concentration of approximately $5 \times 10^{13}$ cm$^{-2}$ in the AlGaN/GaN materials system. They state that the sheet electron concentration is governed by polarisation induced charge and is influenced by interface diffusion. They give few details of how a 2DEG is formed or of the source of electrons for a 2DEG.

Jeganathan et al. (above) have reported, in J. Appl. Phys. 94 (2003) p 3260, that an AlGaN/GaN heterostructure can be used to achieve a 2DEG with a sheet carrier concentration of up to $5 \times 10^{13}$ cm$^{-2}$ without intentional doping of the heterostructure. However, there is no teaching of incorporating an AlGaN/GaN heterostructure into an optoelectronic device to provide an electron gas region and improve the optical efficiency of the device.

U.S. Pat. No. 6,515,313 discloses a light emitting device in which dipole reducing methods (such as interface grading or interface doping) are used to reduce any polarisation induced fields across the active region of the device so as to improve optical efficiency. In the present invention, however, dipoles and a polarisation field are specifically introduced to form an electron gas.

U.S. Pat. No. 6,541,797 discloses a light emitting device fabricated in a nitride materials system and having a 2DEG (with a sheet carrier concentration of less than $5 \times 10^{13}$ cm$^{-2}$) formed in the active region, on its p-type side. The 2DEG region acts as collecting region for efficient electron-hole recombination. In the present invention, in contrast, the electron gas region is situated outside the active region, and is on the n-type side of the active region.

U.S. Pat. No. 6,614,060 describes a light emitting device containing a wide InGaN layer situated below the active region, for electron capture and resonant tunnelling of electrons into the active region. There is no indication that an electron gas is formed anywhere in the device.

Kim et al. report, in Phys. Stat. Sol. (a) 201, (2004), p 2663, the use of an electron tunnelling barrier in a nitride LED for improved optical efficiency. The electron barrier is provided by an AlGaN layer with a thickness of 2 nm located in or just beneath the active region of the LED. The AlGaN layer is reported to reduce hot electron overflow out of the active region. The formation of an electron gas at the interface between the AlGaN tunnelling barrier and underlying GaN is not reported or suggested by Kim et al. Moreover, according to Smorchova et al in J. App. Phys. 86 (1999), p 4520, such a thin AlGaN layer would not result in the formation of a 2DEG.

Luo et al. report, in J. Elec. Matl. 30(5) 2001, p 459, an improvement in photoluminescence emission intensity from InAs quantum dots (QDs) coupled to a 2DEG. The 2DEG is thought to act as an electron reservoir for the QDs, through wave-functions of electrons in the 2DEG overlapping with the QDs. In the present invention, however, the electron gas is outside the active region and so the wavefunction of electrons in the electron gas is not coupled to the active region.

SUMMARY OF THE INVENTION

A first aspect of the present invention provides a method of manufacturing a nitride semiconductor device, the method comprising the steps of: growing an $In_xGa_{1-x}N$ ($0 \leq x \leq 1$) layer; growing an aluminium-containing nitride semiconductor layer over the $In_xGa_{1-x}N$ layer at a growth temperature of at least 500° C., the thickness of the aluminium-containing nitride semiconductor layer being such that an electron gas region thereby forms at an interface between the $In_xGa_{1-x}N$ layer and the aluminium-containing nitride semiconductor layer; and annealing the aluminium-containing nitride semiconductor layer at a temperature of at least 800° C.

The term "electron gas region" as used herein denotes a region in which an electron gas can form. Electrons in an electron gas can have a much higher mobility than those in a bulk semiconductor crystal as a result of fewer interactions (or scattering) with host or dopant atoms.

The term "nitride semiconductor device" as used herein denotes a semiconductor device in which each semiconductor layer is a member of a nitride materials system. One example of a nitride materials system is the (Al,Ga,In)N materials system.

The aluminium-containing nitride semiconductor layer may be grown at a growth temperature of 750° C. or below.

It has been found that use of a relatively low growth temperature for the aluminium-containing nitride semiconductor layer followed by an annealing step leads to the formation of an electron gas, within the electron gas region, having a sheet electron concentration that is significantly higher than the sheet electron concentration of electron gases obtained by prior art methods. The invention makes it possible to obtain an electron gas having a sheet electron concentration at 300K of $6 \times 10^{13}$ cm$^{-2}$ or greater. (All sheet electron concentrations quoted in the description of this invention are under conditions of zero applied electric or magnetic field.) Furthermore, an electron gas with this high sheet electron concentration can be obtained without intentionally doping either the $In_xGa_{1-x}N$ layer or the nitride semiconductor layer, and by using a nitride semiconductor layer with a relatively low aluminium concentration. The invention does not require use of a layer of AlN or AlGaN with a high aluminium mole fraction. The invention can thus lead to improved efficiency and performance of both optoelectronic and electronic devices fabricated in III-nitride semiconductors. The sheet carrier concentration achieved by the invention is higher than can be achieved for conventionally grown modulation doped HFETs having a 2D electron gas (grown according, for example, to the method of Maeda et al. as given in Appl. Phys, Lett. 79 (2001) p 1634).

The nitride semiconductor layer may be an $Al_yGaIn_{1-y-z}N$ ($0<y\leq 1$, $0\leq z\leq 1$) layer.

The $Al_yGa_{1-z}In_{1-y-z}N$ layer may have $0<y<0.3$. Use of an (Al,Ga,In)N layer with such a low aluminium mole fraction will still allow generation of an electron gas with a sheet carrier concentration of $6 \times 10^{13}$ cm$^{-2}$ or greater, but will avoid the disadvantages associated with use of an AlN layer or an (Al,Ga,In)N layer with a high aluminium mole fraction so that a good quality device may still be obtained.

The nitride semiconductor layer may be an $Al_yGa_{1-y}N$ layer.

The nitride semiconductor layer may have a thickness of at least 5 nm, and it may have a thickness of less than 50 nm. The thickness of the nitride semiconductor layer is one factor that determines whether or not an electron gas is formed, and making the thickness of the nitride semiconductor layer within these limits allows formation of an electron gas with a high sheet electron concentration. An electron gas is unlikely to form if the thickness of the nitride semiconductor layer is significantly less than 5 nm or is significantly greater than 50 nm.

The $In_xGa_{1-x}N$ layer may be a layer of GaN.

The $In_xGa_{1-x}N$ layer may have a thickness of at least 20 nm, and it may have a thickness of less than 3 μm. If the thickness of the $In_xGa_{1-x}N$ layer is significantly less than 20 nm it is unlikely to be able to contain an electron gas that accumulates in the electron gas region.

The $In_xGa_{1-x}N$ layer may be not intentionally doped, and the nitride semiconductor layer may be not intentionally doped. The method of the invention does not rely on doping the layers in order to obtain an electron gas with a high sheet electron concentration. This provides an advantage over prior art methods that rely on the use of a heavily doped layer to provide an electron gas with a high sheet electron concentration, since providing a highly-doped layer within a device structure can possibly degrade the performance of the device, or lead to the performance varying with time, owing to diffusion of impurities into other layers of the device.

The $In_xGa_{1-x}N$ layer may alternatively be doped n-type. This is not necessary for formation of an electron gas in the electron gas region, but it will reduce the electrical resistance of the $In_xGa_{1-x}N$ layer, and so allow a thick $In_xGa_{1-x}N$ layer to be incorporated in a device structure without making the electrical resistance of the device too high. The nitride semiconductor layer may alternatively be doped n-type, although doping the nitride semiconductor layer is less important since the nitride semiconductor layer is typically a thin layer and so will have a low resistance even when not intentionally doped. One example of suitable n-type dopant is silicon.

The method may comprise growing the nitride semiconductor layer directly on the $In_xGa_{1-x}N$ layer.

The method may comprise growing the $In_xGa_{1-x}N$ layer and the nitride semiconductor layer in a growth chamber, and may comprise annealing the nitride semiconductor layer in the growth chamber. This is known as "in-situ" annealing, and avoids the need to remove the nitride semiconductor layer from the growth chamber to carry out the annealing. This is of particular advantage when it is desired to grow further layers over the nitride semiconductor layer. The nitride semiconductor layer is preferably annealed immediately after it has been grown and before any further layers are grown.

Alternatively, the layer structure may be removed from the growth chamber so that the nitride semiconductor layer is annealed outside the growth chamber (this is known as "ex-situ" annealing). The layer structure is preferably removed from the growth chamber for annealing immediately after the nitride semiconductor layer has been grown, before any further layers are grown.

The method may comprise growing one or more further (Al,Ga,In)N layers over the nitride semiconductor layer. Moreover, one or more further (Al,Ga,In)N layers may have been grown before the $In_xGa_{1-x}N$ layer is grown. This allows the electron gas region to be incorporated in the structure of an (Al,Ga,In)N electronic or optoelectronic device such as an LED, LD, HEMT or HFET.

An electron gas having a sheet carrier concentration of $6\times10^{13}$ $cm^{-2}$ or greater, or having a sheet carrier concentration of $1\times10^{14}$ $cm^{-2}$ or greater, at a temperature of 300K, may form in the electron gas region.

The step of annealing the nitride semiconductor layer may have a duration of 10 minutes or less.

A second aspect of the present invention provides a semiconductor light-emitting device fabricated in a nitride material system and comprising: an active region for light emission and an electron gas region disposed on the n-type side of the active region; wherein the electron gas region contains, in use, an electron gas having, at 300K, a sheet electron density of at least $6\times10^{13}$ $cm^{-2}$.

In operation of the device electrons accumulate in the electron gas region and form an electron gas. The electron gas provides a region of highly concentrated electron charge outside the active region but at or near the n-side boundary of the active region, and acts as an electron reservoir to supply carriers into the active region. Provision of the electron gas region in the device thus improves the injection of electrons into the active region of the device, thereby improving the optical efficiency of the light-emitting device (the optical efficiency is defined as the ratio of the optical output power of the device to the electrical power consumed by the device).

An electron gas region may consist of, for example, a potential well in which electrons can accumulate to form an electron gas. Depending on the shape and thickness of the potential well, the electrons in the electron gas may be confined in the direction perpendicular to the plane of the quantum well and may be free to move only in the two dimensions parallel to the plane of the quantum well; in this case, the electron gas is known as a "two-dimensional electron gas" (2DEG). Alternatively, the electrons of the electron gas may be free to move in all three dimensions in which case the electron gas is known as a three-dimensional electron gas (3DEG).

The device may comprise a first layer disposed on the n-type side of the active region and a second layer forming part of the active region of the device and disposed adjacent to the first layer, the second layer having a different composition from the first layer whereby the electron gas region is defined at the interface between the first layer and the second layer. The first layer does not form part of the active region, and the electron gas region is outside the active region (on the n-side of the active region).

The first layer may be disposed immediately adjacent to the second layer. This places the electron gas region as close as possible to the active region, thereby providing the greatest possible improvement in injection of electrons into the active region and hence giving the highest possible improvement in optical efficiency of the device.

The electron gas region may contain, in use, a 2-dimensional electron gas or a 3-dimensional electron gas.

The first layer may be a GaN layer, or it may be an InGaN layer. The second layer may be an AlGaN layer.

The electron gas region may be not intentionally doped. Where the electron gas region comprises the first and second layers mentioned above, this requires that the first layer and the second layer are not intentionally doped.

Alternatively the electron gas region may be doped n-type. Where the electron gas region comprises the first and second layers mentioned above, this requires that at least one of the first layer and the second layer is doped n-type. Silicon is one example of a suitable dopant.

The device may be a light-emitting diode, or it may be a semiconductor laser device.

BRIEF DESCRIPTION OF THE DRAWINGS

Preferred features of the present invention will now be described by way of illustrative example with reference to the accompanying figures in which.

DESCRIPTION OF THE PREFERRED EMBODIMENTS

Figure 1:
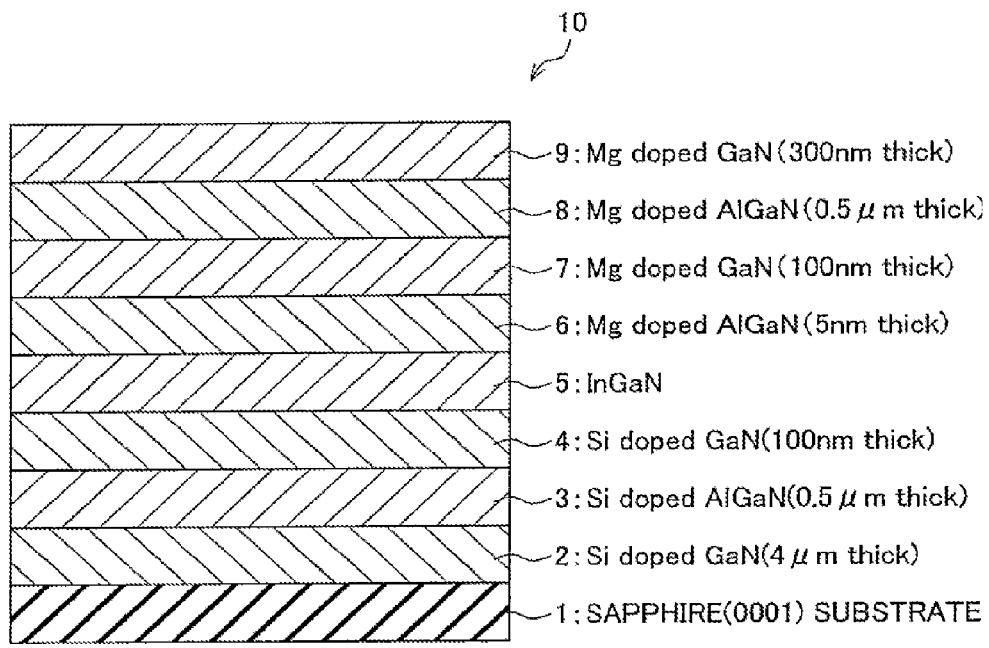
FIG. 1 is a schematic sectional view of a known semiconductor laser device fabricated in the (Al,Ga,In)N system.
Figure 2:
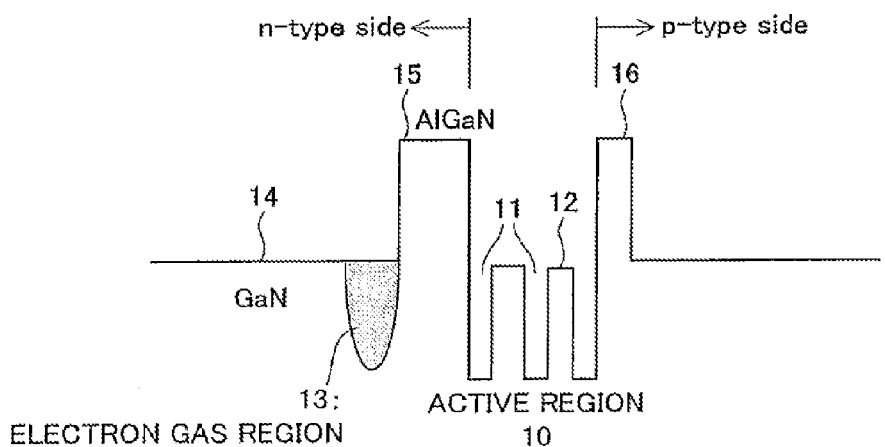
FIG. 2 is a schematic conduction band diagram of a device according to the present invention.

FIG. 2 is a schematic illustration of the conduction band of a light-emitting device according to one embodiment of the present invention. The device has an active region for light emission. The active region comprises quantum well layers 11, with a barrier layer 12 being disposed between each two adjacent quantum well layers 11. FIG. 2 shows the active region as having three quantum well layers 11 and two barrier layers 12, but the invention is not limited to this specific construction of the active region.

The active region further comprises a first barrier layer 15 disposed immediately below the lowest quantum well layer 11 and a second barrier layer 16 disposed immediately above the uppermost quantum well layer 11. In the example of FIG. 2, the first and second barrier layers are each an AlGaN layer.

The portion of the device lying to the left, in FIG. 2, of the active region 10 is the n-type side of the device, and the portion of the device lying to the right, in FIG. 2, of the active region 10 is the p-type side of the device. An n-type contact (not shown) is provided in the n-type side of the device and a p-type contact (also not shown) is provided in the p-type side of the device.

According to the present invention, an electron gas region 13 is provided in the device, on the n-type side of the active region 10 and outside the active region. When the device is in operation, an electron gas having a sheet electron density of at least $6 \times 10^{13}$ cm$^{-2}$ forms in the electron gas region 13.

In the embodiment of FIG. 2, the device comprises a first layer 14 disposed on the n-type side of the active region 10. The first layer 14 is preferably directly adjacent to the first barrier layer 15. The first layer 14 has a different composition from the first barrier layer 15. The conduction band level of the first barrier layer 15 is not equal to the conduction band level of the first layer 14 because of the difference in their compositions so that, as is well known, a potential well is formed at the interface between the first layer 14 and the first barrier layer 15. The potential well forms the electron gas region 13—when the device is in operation, electrons accumulate in the potential well at the interface between the first layer 14 and the first barrier layer 15 and an electron gas is thereby formed at the interface. The confinement of the electrons of the electron gas in the direction perpendicular to the plane of the potential well (that is, the direction from left to right in FIG. 2), is determined by the width of the well, and if the well is sufficiently narrow the electron gas in the well will be a 2-dimensional electron gas (2DEG).

The first barrier layer 15 is preferably relatively thin. This ensures that the separation between the electron gas and the quantum wells of the active region is made as small as possible (being equal to the thickness of the second layer 15), and so provides the most efficient injection of electrons from the electron gas into the quantum wells of the active region thereby providing the greatest possible increase in optical efficiency of the device.

The device of FIG. 2 is fabricated in a nitride material system. As an example, the device may be fabricated in the (Al,Ga,In)N system, in which case the quantum well layers 11 may be InGaN layers and the barrier layers 12 may be GaN layers. The first layer and the first barrier layer 14,15 defining the electron gas region 13 may be a GaN layer and an AlGaN layer respectively, as shown in FIG. 2, or they may be an InGaN layer and an AlGaN layer respectively. If the first layer 14 is an InGaN layer, a suitable range for the indium mole fraction x in In$_x$Ga$_{1-x}$N is $0 \leq x \leq 0.1$.

The second barrier layer 16 may be formed of, for example, p-type doped AlGaN.

The aluminium concentration of the first barrier layer 15 is preferably 0.3 or below; that is, the first barrier layer 15 has the composition Al$_x$Ga$_{1-x}$N with $0 < x \leq 0.3$. Use of a layer with such a relatively low aluminium concentrations will avoid the disadvantages associated with use of an AlN layer or an AlGaN layer with a high aluminium mole fraction so that a good quality device may still be obtained. In particular, an AlGaN layer having an aluminium mole fraction of up to 0.3 will not lead to the generation of significant strain within the device, to the formation of significant numbers of dislocations, nor to significant incorporation of unwanted impurities. The second barrier layer 16 preferably also has the composition Al$_x$Ga$_{1-x}$N with $0 < x \leq 0.3$.

The thickness of the first barrier layer 15 is chosen such that an electron gas region is formed at the interface between the first barrier layer 15 and the first layer 14. To achieve this, the thickness of the first barrier layer 15 is preferably between at least 5 nm, and is preferably less than 50 nm. This range of thickness provides the greatest optical output power of the device. The first layer 14 preferably has a thickness of more than 20 nm (so as to provide effective confinement of electrons in the electron gas region) but less than 3 μm (although the thickness of the first layer 14 is less important than the thickness of the first barrier layer 15). These thickness ranges have been found to be suitable for obtaining an electron gas with a high sheet electron concentration. In particular, it is unlikely that an electron gas will be obtained if the thickness of the first barrier layer 15 is significantly less than 5 nm or is significantly greater than 50 nm.

Whether the electron gas that forms in the electron gas region 13 is a 2-dimensional electron gas or a 3-dimensional electron gas is determined primarily by the thickness of the first barrier layer 15. If the thickness of the first barrier layer 15 is less than approximately 20 nm it is likely that a 2-DEG will form in the electron gas region, whereas if the thickness of the first barrier layer 15 is greater than approximately 20 nm it is likely that a 3-DEG will form in the electron gas region 13.

The first layer 14 and the first barrier layer 15 of the device structure of FIG. 2 may be not intentionally doped. If the device is fabricated according to the method described below, an electron gas with a high sheet electron concentration can be obtained even if the first layer 14 and the first barrier layer 15 of the device of FIG. 2 are both nominally undoped. This is an advantage, since providing a highly-doped layer within a device structure can degrade the performance of the device owing to unwanted diffusion of dopants into other layers of the device.

Alternatively, one or both of the first layer 14 and the first barrier layer 15 of the device structure of FIG. 2 may be intentionally doped n-type if desired. For example, if the first layer 14 is a thick layer, it might be desirable to dope the first layer to reduce its electrical resistance. The formation of an electron gas in the electron gas region 13 is not significantly influenced by the doping level of the first layer 14.

Figure 3:
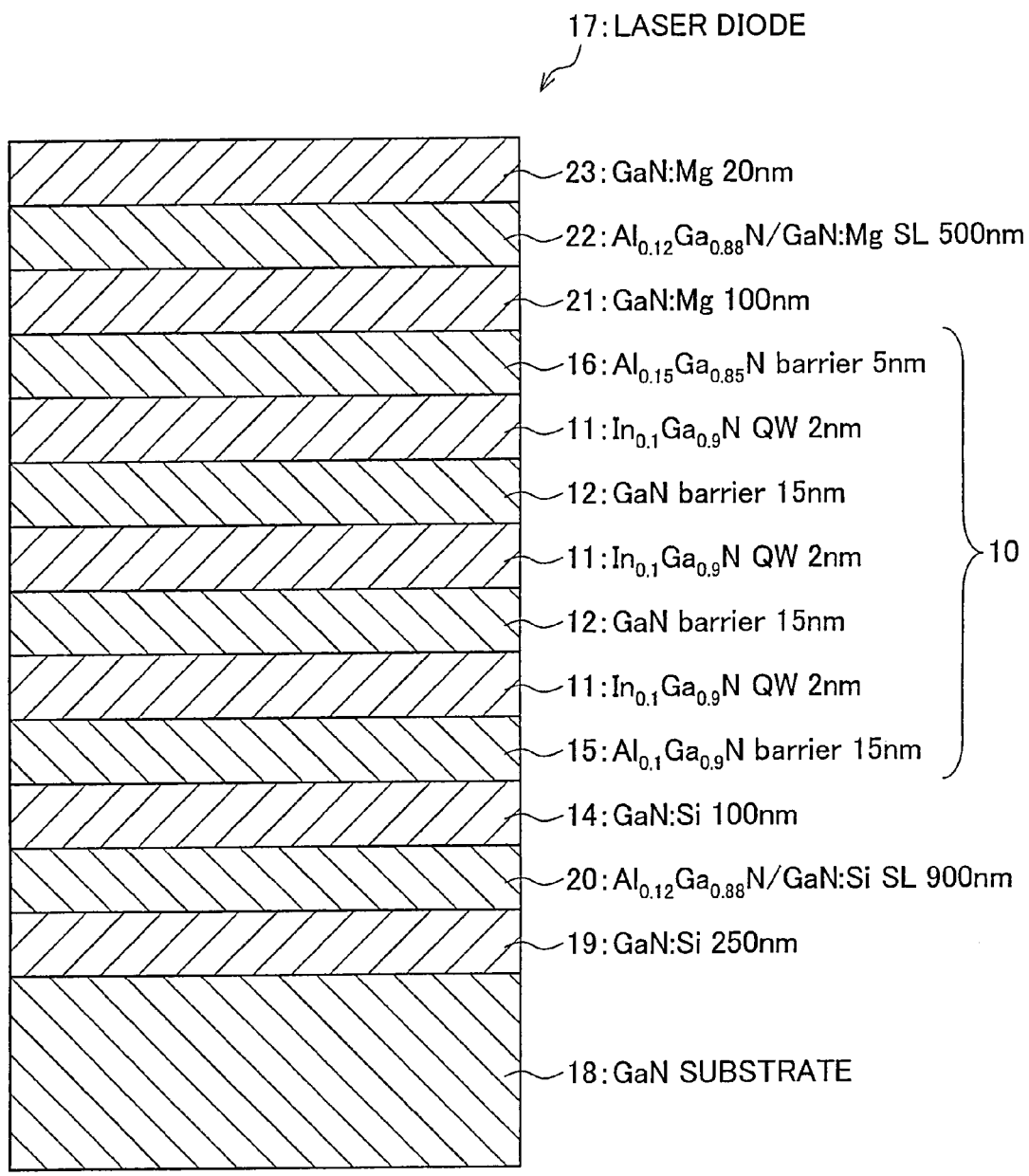
FIG. 3 is a schematic sectional view of a semiconductor laser device according to an embodiment of the present invention.

FIG. 3 is a schematic sectional view of a semiconductor laser diode incorporating the present invention. The laser diode 17 has a substrate 18, and a buffer layer 19 grown over the substrate. In the example of FIG. 3 the substrate 18 is a GaN substrate, and the buffer layer 19 is an n-type GaN layer, with a thickness of 250 nm. Silicon is a suitable dopant.

An n-type cladding region 20 is disposed over the buffer layer 19. In the example of FIG. 3 the n-type cladding region 20 has a superlattice structure and is formed of layers of AlGaN with an aluminium mole fraction of 0.12 alternating with layers of GaN. The cladding region of FIG. 3 has a thickness of 900 nm. However, the laser device is not limited to the specific form or thickness of n-type cladding region shown in FIG. 3.

The first layer 14 is grown over the n-type cladding layer 20. In the embodiment of FIG. 3, the first layer 14 is an n-type doped GaN layer, with a thickness of 100 nm. Silicon is used as the dopant.

The active region 10 is grown over the first layer 14. In the example of FIG. 3, the first barrier layer 15 is a 15 nm thick layer of $Al_{0.1}Ga_{0.9}N$, each of the quantum well layers 11 is a 2 nm thick layer of $In_{0.1}Ga_{0.9}N$, each of the intermediate barrier layers 12 is a 15 nm thick layer of GaN, and the second barrier layer 16 is a 5 nm thick layer of $Al_{0.15}Ga_{0.85}N$. In the embodiment of FIG. 3, each layer of the active region 10 is not intentionally doped.

An optical guiding region 21 is grown over the active region. In the embodiment of FIG. 3 the optical guiding region 21 is a layer of GaN which is doped p-type and has a thickness of 100 nm. Magnesium is a suitable p-type dopant.

A p-type cladding region 22 is provided over the optical guiding region 21. In the example of FIG. 3 the p-type cladding region 22 has a superlattice structure and is formed of layers of AlGaN with an aluminium mole fraction of 0.12 alternating with layers of GaN. The p-type cladding region of FIG. 3 has a thickness of 500 nm. However, the laser device is not limited to the specific form or thickness of p-type cladding region shown in FIG. 3.

A p-type cap layer 23 is provided over the p-type cladding region 22. In the embodiment of FIG. 3 the cap layer 23 is a 20 nm thick layer of GaN doped p-type. Magnesium is a suitable dopant.

Metallic contacts (not shown in FIG. 3) are provided on the n-side and the p-side of the active region 10. The contacts may conveniently be provided on the underside of the substrate 18 and on the upper surface of the cap layer 23.

Figure 4:
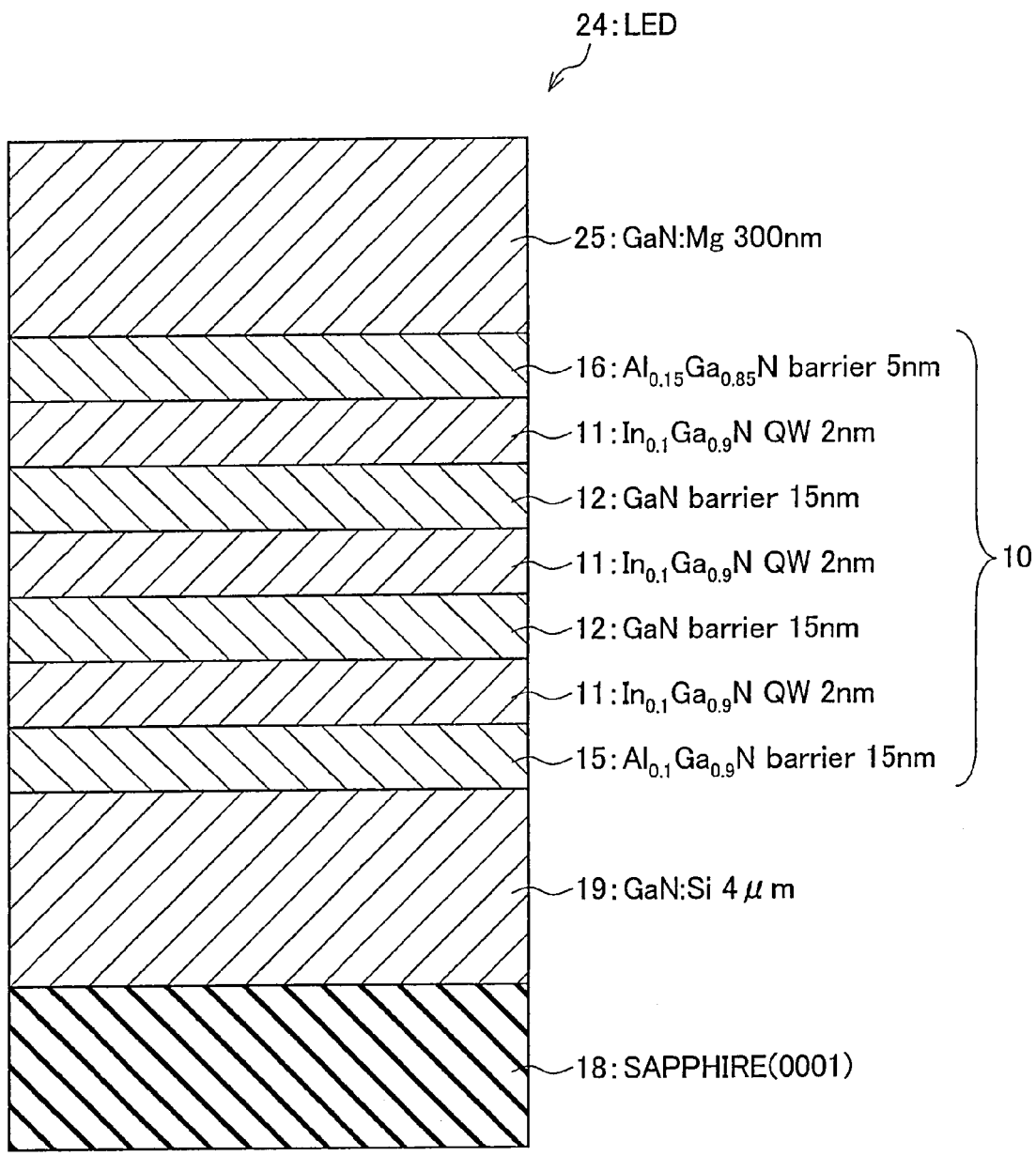
FIG. 4 is a schematic sectional view of a light-emitting diode according to an embodiment of the present invention.

FIG. 4 shows an LED 24 that incorporates the present invention. The LED 24 has a substrate 18. In the embodiment of FIG. 4 the substrate is a sapphire substrate having its (0001) face uppermost.

A buffer layer 19 is grown over the substrate 18. In the embodiment of FIG. 4 the buffer layer 19 is an n-type doped GaN layer with a thickness of 4 μm. Silicon is a suitable dopant.

The active region 10 is grown over the buffer layer 18. The active region of the LED of FIG. 4 is identical to the active region of the laser diode of FIG. 3, and its description will not be repeated.

The LED 24 of FIG. 4 further includes a cap layer 25 grown over the active region 10. In FIG. 4, the cap layer 25 is a p-type doped GaN layer with a thickness of 300 nm. Magnesium is a suitable dopant.

Metallic contacts (not shown in FIG. 4) are provided on the n-side and the p-side of the active region 10. The contacts may conveniently be provided on the underside of the substrate 18 and on the upper surface of the cap layer 25.

Figure 5:
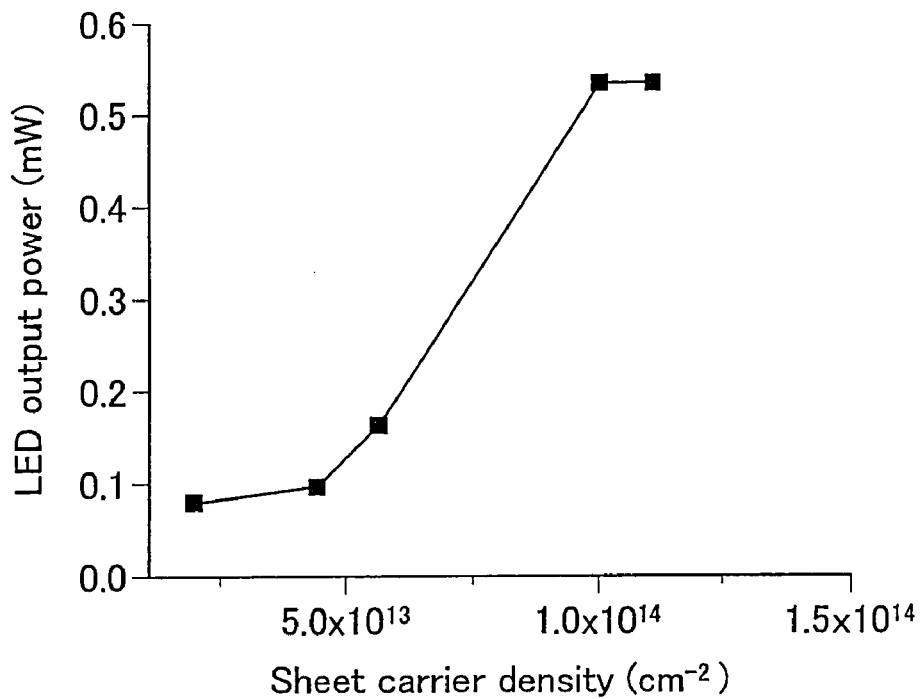
FIG. 5 shows the output optical power of a light-emitting diode of the present invention.
Figure 6:
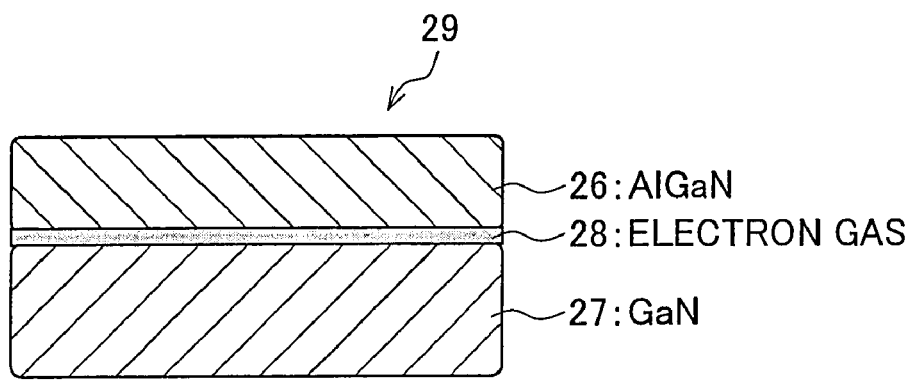
FIG. 6 is a schematic sectional view of a semiconductor layer structure grown according to a method of the invention.

FIG. 5 shows how the optical output power of an LED that incorporates the electron gas region of the present invention depends on the sheet carrier density (at 300K) of the electron gas in the electron gas region. The values of output power shown in FIG. 5 were obtained from LEDs having the general structure shown in FIG. 4 but containing electron gases of different sheet electron concentration. The values of the sheet electron concentration were obtained from Hall effect measurements on equivalent electron gases using a structure 29 as shown in FIG. 6 in which an $Al_yGa_{1-y}N$ layer 26 is disposed on an $In_xGa_{1-x}N$ layer 27 so that an electron gas region 28 forms at their interface. The GaN and AlGaN layers 26,27 of the structure 29 of FIG. 6 used to obtain the sheet electron concentration of a particular electron gas had the same composition and thickness as the first layer 14 and first barrier layer 15 of the LED used in the measurement of the output power produced by an LED having that particular electron gas. Thus, two separate structures were used to obtain each data point in FIG. 5.

As can be seen from FIG. 5, the optical output power of the LED increases as the sheet carrier concentration of the electron gas increases. A conventional device without an electron gas region would be expected to have an output power of approximately 50 μW (0.05 mW). The increase in optical output with the sheet concentration of the electron gas is initially relatively low, but the curve of FIG. 5 has an "elbow" for sheet electron concentrations (at 300K) in the range from approximately $4.5 \times 10^{13}$ cm$^{-2}$ to approximately $6 \times 10^{13}$ cm$^{-2}$. For a sheet electron concentration at 300K of greater than $6 \times 10^{13}$ cm$^{-2}$, the optical output of the LED increases rapidly as the sheet electron concentration of the electron gas increases. It is therefore preferable that the electron gas in the electron gas region 13 has a sheet electron concentration at 300K of at least $6 \times 10^{13}$ cm$^{-2}$.

It is believed that the relationship between the optical output power and the sheet electron concentration of the electron gas for a light-emitting device of the present invention will always have the general form shown in FIG. 5. In particular, the relationship between the optical output power and the sheet electron concentration is expected to have an "elbow" above which the optical output of the device increases rapidly as the sheet electron concentration of the electron gas increases. Incorporating an electron gas region that contains, in use, an electron gas having a sheet electron density at 300K of at least $6 \times 10^{13}$ cm$^{-2}$ should therefore lead to a device with a high optical power output.

One method of manufacturing the device structure of FIG. 2 will now be described. In order to grow the semiconductor layer structure of FIG. 2, a suitable substrate (not shown in FIG. 2) is prepared and cleaned in any suitable way, and is then introduced into the growth chamber of a growth apparatus. One suitable substrate is a template substrate consisting of an n-type doped GaN layer grown over a sapphire base substrate, but the invention is not limited to any specific substrate. The invention is further not limited to any specific growth apparatus, and the device may be fabricated by any conventional semiconductor growth technique such as, for example MBE (molecular beam epitaxy) or MOVPE (metal-organic vapour phase epitaxy).

One or more layers, such as for example a buffer layer, n-type cladding layer and, in the case of a laser diode, an n-type optical guiding layer are grown over the substrate. The growth of these layers does not form part of the present invention and will not be described further.

The first layer 14 (an $In_xGa_{1-x}N$ layer) is then grown. The $In_xGa_{1-x}N$ layer 14 is grown at a growth temperature of at least 500° C. (In general, the substrate is heated during the growth process, and the "growth temperature" is defined as the temperature of the substrate.)

The AlGaN layer 15 is then grown directly over the $In_xGa_{1-x}N$ layer 14. The AlGaN layer 15 is grown at a growth temperature of at least 500° C. The growth temperature of the AlGaN layer 15 may in principle be different from the growth temperature of the $In_xGa_{1-x}N$ layer 14. The growth temperature of the AlGaN layer 15 is preferably less than 750° C. since, as is described below, a relatively low growth temperature, followed by annealing, leads to an electron gas with a high sheet electron concentration; an electron gas with a high sheet electron concentration (at 300K), for example greater than $6 \times 10^{13}$ cm$^{-2}$ and even up to $1 \times 10^{14}$ cm$^{-2}$ or above, can be obtained in this way. The growth method described with reference to example 1 of Table 1 below is one example of a growth method that can obtain an electron gas with a sheet electron concentration, at 300K, greater than $1 \times 10^{14}$ cm$^{-2}$.

The AlGaN layer 15 is subsequently annealed at a temperature that is at least 800° C. and that is at least 50° C. greater than its growth temperature. The annealing may be performed in the growth chamber of the growth apparatus, by stopping the growth process and increasing the temperature within the growth chamber to the desired temperature for annealing the AlGaN layer (this is known as in situ annealing). Alternatively, the substrate may be removed from the growth chamber to allow the annealing to be performed externally to the growth chamber (this is known as ex situ annealing). As stated above, an electron gas region is set up at the interface between the AlGaN layer 15 and the $In_xGa_{1-x}N$ layer 14, and the effect of the annealing step is to increase the sheet electron concentration of the electron gas that forms in the electron gas region. Further details of the annealing step are given below.

If the annealing step is an ex situ annealing step, the substrate is returned to the growth chamber after the annealing step has been completed.

The quantum well layers 11 and barrier layers 12 are then grown, to form the active region 10. The p-type layer 16 is then grown over the active region 10.

Other layers such a cap layer and/or a p-type contact layer are then grown over the p-type layer 16, to complete the device. The growth of these subsequent layers does not form part of the present invention and will not be described further.

Finally, the substrate is diced into individual devices, and contacts are provided (the steps of dicing the wafer and forming the contacts do not form part of the present invention and will not be described further.

In the example of FIG. 2 described above the first barrier layer 15 was an AlGaN layer. The invention is not limited to an AlGaN layer as the first barrier layer, however, and the first barrier layer may in principle be a layer of any suitable aluminium-containing nitride semiconductor including, for example, AlGaInN.

In the embodiments described above the first layer 14 is adjacent to the first barrier layer 15. While this is desirable, an electron gas with a high sheet carrier concentration may be obtained according to the invention even if a thin intermediate layer is grown between the first layer 14 and the first barrier layer 15. For example, an InGaN quantum well layer may be grown between the first layer 14 and the first barrier layer 15, and such a layer would have a typical thickness of approximately 10 nm. As another example, a layer of silicon (known as a delta-layer) may be grown between the first layer 14 and the first barrier layer 15, and a silicon delta-layer would have a typical thickness of approximately 0.5 nm.

More details of the annealing step will now be given with reference to FIG. 6. As previously stated, the semiconductor layer structure 29 of FIG. 6 comprises an $Al_yGa_{1-y}N$ ($0<x \leq 1$) layer 26 grown over an $In_xGa_{1-x}N$ ($0 \leq x \leq 1$) layer 27. An electron gas region 28 is created at the interface between the $Al_yGa_{1-y}N$ layer 26 and the $In_xGa_{1-x}N$ layer 27. In FIG. 6 the $In_xGa_{1-x}N$ layer 27 is shown as a GaN layer, but the layer 27 may alternatively have a non-zero indium mole fraction. The indium mole fraction is preferably in the range $0 \leq x \leq 0.05$.

In order to grow the semiconductor layer structure 29 of FIG. 6, a suitable substrate (not shown in FIG. 6) is prepared and cleaned in any suitable way, and is then introduced into the growth chamber of a growth apparatus. One suitable substrate is a template substrate consisting of an n-type doped GaN layer grown over a sapphire base substrate, but the invention is not limited to any specific substrate. The invention is further not limited to any specific growth apparatus, and the invention may be implemented by any conventional semiconductor growth technique such as, for example MBE (molecular beam epitaxy) or MOVPE (metal-organic vapour phase epitaxy).

The $In_xGa_{1-x}N$ layer 27 is then grown over the substrate. The $In_xGa_{1-x}N$ layer 27 is grown at a growth temperature of at least 500° C., and preferably at a growth temperature of at least 600° C. (In general, the substrate is heated during the growth process, and the "growth temperature" is defined as the temperature of the substrate.)

Where the layer structure 29 of FIG. 6 is incorporated in a device structure, one or more layers may be grown over the substrate before the $In_xGa_{1-x}N$ layer 27 is grown. The growth of any such intervening layers does not form part of the growth method of the present invention and will not be described further.

An aluminium-containing nitride semiconductor layer 26, in this embodiment an $Al_yGa_{1-y}N$ layer, is then grown over the $In_xGa_{1-x}N$ layer 27. The $Al_yGa_{1-y}N$ layer 26 is grown at a growth temperature of at least 500° C., and preferably at a growth temperature of at least 600° C. The growth temperature of the $Al_yGa_{1-y}N$ layer 26 may in principle be different from the growth temperature of the $In_xGa_{1-x}N$ layer 27. In one embodiment the $Al_yGa_{1-y}N$ layer 26 may have a thickness of 20 nm and an Al mole fraction of 0.1, but the invention is not limited to this specific thickness or Al mole fraction for the $Al_yGa_{1-y}N$ layer 26.

Moreover, the growth temperature of the nitride semiconductor layer 26 is preferably 750° C. or lower, for reasons which are explained below.

The nitride semiconductor layer is preferably grown directly on the $In_xGa_{1-x}N$ layer 27, so that there are no intervening layers between the nitride semiconductor layer and the $In_xGa_{1-x}N$ layer 27. However, an electron gas with a high sheet carrier concentration may be obtained by the method of the invention even if a thin intermediate layer (such as the thin InGaN quantum well layer or the silicon delta-layer described above) is grown between the nitride semiconductor layer and the $In_xGa_{1-x}N$ layer.

According to the invention, the nitride semiconductor layer 26 (the $Al_yGa_{1-y}N$ layer in this embodiment) is subsequently annealed at a temperature that is at least 800° C. and that is greater than its growth temperature. The temperature at which the nitride semiconductor layer 26 is annealed is preferably at least 50° C. higher that the growth temperature of the nitride semiconductor layer 26. As explained above, an electron gas region is set up at the interface between the nitride semiconductor layer 26 and the $In_xGa_{1-x}N$ layer 27, and the effect of the annealing step of the invention is to increase the sheet electron concentration of the electron gas that forms in the electron gas region.

A typical duration of the annealing step is one minute. It should be noted that the rate at which the substrate temperature is increased to a desired annealing temperature and the rate at which the substrate temperature is reduced after an annealing step should be kept sufficiently low to avoid inducing significant thermal stresses in the substrate or in the layers grown over the substrate; this applies to both in-situ annealing and ex-situ annealing. A temperature ramp rate of no more than 40-50° C./minute has been found to be suitable for in-situ annealing, although a temperature ramp rate of up to 100° C./minute can be used for ex-situ annealing. The duration of the annealing step, as that term is used herein, is the time at the annealing temperature, and does not include the time required to ramp the temperature up to the annealing temperature and subsequently to ramp the temperature down. Thus, even though the annealing step has a duration typically of a minute or a few minutes it would, in the case of in-situ annealing, take approximately 6-10 minutes to increase the substrate temperature from a growth temperature of 500° C. to an annealing temperature of 800° C., for example, and approximately a further 6-10 minutes after the annealing step to reduce the substrate temperature to a suitable temperature for the growth of the next layer.

Where the layer structure 29 of FIG. 6 is incorporated in a device structure, one or more layers may be grown over the $Al_yGa_{1-y}N$ layer 26, and/or one or more layers may be grown before the GaN layer 27 is grown. For example, an active region may be grown over the layer structure 29. Alternatively, further layers may be grown over the layer structure 29 to provide an active region for light emission that incorporates the nitride semiconductor layer 26 (but not the GaN layer 27) so as to obtain a device of the general type described above with reference to FIG. 2. The growth of any such further layers does not form part of the growth method of the present invention and will not be described further.

The annealing step may be an "in situ" annealing step carried out in the growth chamber of the growth apparatus, or it may be an "ex situ" annealing step in which the annealing step is carried out after the layer structure has been removed from the growth chamber. In both cases, the annealing step may be carried out immediately after the $Al_yGa_{1-y}N$ layer 26 has been grown, or it may be carried out after one or more further layers have been grown over the $Al_yGa_{1-y}N$ layer 26. Where the layer structure of FIG. 6 is incorporated in a device structure, performing the annealing step immediately after the $Al_yGa_{1-y}N$ layer 26 has been grown has the possible advantage that any layers grown over the $Al_yGa_{1-y}N$ layer 26 will not be annealed, whereas performing the annealing after the complete structure has been grown means that every layer of the device will be annealed. However, where the layer structure of FIG. 6 is incorporated in a device structure, performing the annealing step immediately after the $Al_yGa_{1-y}$ N layer 26 has been grown has the disadvantage that the growth process must be stopped to allow the annealing step to be carried out. An ex-situ annealing step may be preferable in the case of, for example, annealing multiple batches of wafers in the mass-production of devices.

Results of the invention are shown in Table 1.

TABLE 1

| AlGaN growth temperature (° C.) | AlGaN anneal temperature (° C.) | 300K sheet electron concentration (cm$^{-2}$) | 300K electron mobility (cm$^2$V$^{-1}$s$^{-1}$) | 300K sheet resistance (□) |
|---|---|---|---|---|
| 630 | 880 | $1 \times 10^{14}$ | 200 | 330 |
| 630 | No anneal | $1 \times 10^{13}$ | 830 | 770 |
| 900 | No anneal | $2 \times 10^{13}$ | 600 | 600 |

The first entry in Table 1 relates to a semiconductor layer structure grown by the method of the invention, with the $Al_yGa_{1-y}N$ layer 26 being grown at a growth temperature of 630° C. and annealed in situ at a growth temperature of 880° C. The second and third entries in Table 1 relate to comparative examples—in the second entry the $Al_yGa_{1-y}N$ layer is grown at a growth temperature of 630° C. but is not annealed, and in the third entry the $Al_yGa_{1-y}N$ layer is grown at the higher growth temperature of 900° C. and is not annealed.

The first entry 1 of table 1 was produced using a semiconductor layer structure having an undoped GaN template substrate. A 1 μm thick layer of nominally undoped GaN was grown over the substrate at a growth temperature of 900° C., in an MBE chamber under ammonia vapour. The growth temperature was then reduced to 630° C., and a 20 nm thick layer of nominally undoped $Al_{0.1}Ga_{0.9}N$ was grown at the growth temperature of 630° C., again in the MBE chamber under ammonia vapour. The temperature of the sample was raised to 880° C. over a period of 10 mins and was maintained at 880° C. for one minute, after which the sample was cooled to a temperature of less than 200° C. over a period of 15 mins.

As can be seen from Table 1, the method of the present invention provides an electron gas with a sheet electron concentration that is significantly greater than the sheet electron concentration of the electron gas obtained using the comparative growth methods. The sheet electron concentration of the electron gas obtained by the method of the present invention, using the growth and annealing temperatures given in the first entry in Table 1, is $1 \times 10^{14}$ cm$^{-2}$ (measured at a temperature of 300K). The comparative growth methods shown in the second and third entries in Table 1 produce an electron gas with a sheet electron concentration of only $1 \times 10^{13}$ cm$^{-2}$ or $2 \times 10^{13}$ cm$^{-2}$ respectively (again measured at 300K). The probable mechanism for this increase in the sheet electron concentration provided by the invention is that nitrogen vacancies are created in the $Al_yGa_{1-y}N$ layer 26 and/or at its surface during the annealing step. The vacancies contribute extra electrons to the electron gas, and hence lead to a high sheet carrier concentration for the electron gas.

It will be seen that the electron mobility of the electron gas obtained by the method of the invention is slightly lower than the electron mobility of the electron gases obtained by the comparative methods given in the second and third entries of Table 1. However, the factor by which the electron mobility is reduced is significantly less than the factor by which the sheet electron concentration is increased.

The results of Table 1 were obtained using a layer structure as shown in FIG. 6. The aluminium-containing nitride layer 26 was an AlGaN layer with an aluminium mole fraction of 0.1 and a thickness of 20 nm, and was annealed immediately following the growth of the AlGaN layer. The GaN layer was grown at a temperature of 900° C. and had a thickness of 1 μm, although neither the growth temperature of the GaN layer nor its thickness should significantly affect the electron concentration of the resultant electron gas.

The results in the first line of Table 1 were obtained using an annealing temperature of 880° C., as shown. For an in-situ annealing step, the annealing temperature is preferably within the temperature range of from 800° C. to 1000° C. (although higher annealing temperatures can be used in an ex-situ annealing step). In the case of an in-situ annealing step, it has been found that an annealing temperature of approximately 880° C. leads to the highest sheet electron concentration of the electron gas, and that the use of an annealing temperature that is significantly higher or lower than 880° C. leads to a lower sheet carrier concentration. Where in-situ annealing is used, the annealing temperature is therefore particularly preferably approximately 880° C.

The results of the first line of Table 1 were obtained using an annealing step having a duration of 1 minute. The annealing step is not limited to this duration, and the duration of the annealing step may be shorter or longer than 1 minute. In general, the higher is the annealing temperature, the shorter is the required annealing time (for both in-situ and ex-situ annealing).

It has been found that a long duration of the annealing step results in a reduction of the sheet carrier concentration, and this is probably due to surface roughening. The duration of the annealing step is therefore preferably less than an hour, for both in-situ and ex-situ annealing. In many case, annealing times considerably shorter than an hour can be used. For many annealing temperatures an annealing time of 10 minutes or below, or even 2 minutes or below, will provide a high sheet carrier concentration.

Table 2 shows further results of the invention, for the case where the aluminium-containing nitride layer 26 (in this example, again an $Al_yGa_{1-y}N$ layer) is annealed ex situ.

TABLE 2

| Ex-situ anneal temperature (° C.) | 300K sheet carrier concentration (cm$^{-2}$) | 300K electron mobility (cm$^2$V$^{-1}$s$^{-1}$) |
| --- | --- | --- |
| No anneal | $2.4 \times 10^{13}$ | 598 |
| 1000 | $3.0 \times 10^{13}$ | 451 |
| 1050 | $4.7 \times 10^{13}$ | 263 |
| 1100 | $6.0 \times 10^{13}$ | 186 |

The first entry in Table 2 relates to a comparative example in which the $Al_yGa_{1-y}N$ layer 26 is not annealed, and the second, third and fourth entries show the effect of an ex situ annealing step at temperatures of 1000° C., 1050° C. and 1100° C. respectively. As can be seen, the effect of the annealing step is to increase the sheet electron concentration of the resultant electron gas (compared to the sheet electron concentration obtained in the absence of an annealing step). The greater the temperature of the annealing step, the greater is the sheet electron concentration of the resultant electron gas, and an annealing temperature of 1100° C. produces an electron gas having a sheet electron concentration of $6.0 \times 10^{13}$ cm$^{-2}$. The increase in the sheet electron concentration probably occurs as a result of nitrogen vacancies being created at the surface of the $Al_yGa_{1-y}N$ layer 26.

The results of Table 2 were obtained using the same layer structure as for Table 1, with a 20 nm thick $Al_{0.1}Ga_{0.9}N$ as the aluminum-containing layer 26. The GaN layer and the AlGaN layer were each grown at a temperature of 900° C. In each case where an annealing step was performed it had a duration of one minute.

In more detail, the fourth entry of Table 2 was obtained using a semiconductor structure having an undoped GaN template substrate. A 1 mm thick layer of nominally undoped GaN was grown over the substrate at 900° C., in an MBE chamber under ammonia vapour, and a 20 nm thick layer of undoped $Al_{0.1}Ga_{0.9}N$ was then grown, also at 900° C. in the MBE chamber under ammonia vapour. The sample was then cooled to a temperature of 200° C. or below over a period of in 15 minutes, and was then removed from the MBE chamber and inserted into a rapid thermal annealer. In the rapid thermal annealer, the sample, was heated under a nitrogen atmosphere to a temperature of 1100° C. in 1 minute, was annealed at 1100° C. for 1 minute under nitrogen atmosphere, and was then cooled to a temperature of 300° C. or below in 1 minute under a nitrogen atmosphere.

It will be seen that the sheet carrier concentrations of Table 2 are lower than those of Table 1. This arises from the higher growth temperature of the AlGaN layer in Table 2 (900° C.) compared to Table 1 (630° C.). As stated above, the growth temperature of the nitride semiconductor layer is preferably 750° C. or below, and particularly preferably is 700° C. or below. It has been found that, with all other factors being kept constant, a growth temperature for the nitride semiconductor layer in the range 500-750° C. leads to the highest sheet electron concentration for the resultant electron gas. (It should be noted, however, that an electron gas with a sheet carrier concentration at 300K of $6 \times 10^{13}$ cm$^{-2}$ can be obtained for any growth temperature for the nitride semiconductor layer greater than 500° C. provided that the annealing temperature is made sufficiently high, although the electron mobility may be lower than for a growth temperature in the range 500° C.-750° C.) As mentioned above, it is believed that the high sheet electron concentration obtained by the invention result from nitrogen vacancies created in the nitride semiconductor layer 26 and/or at its surface during the annealing step—and it is further believed that a growth temperature for the nitride semiconductor layer in the range 500° C.-750° C. leads to a higher density of nitrogen vacancies.

Moreover, it is expected that reducing the nitrogen pressure used for the ex-situ anneal will lead to a higher sheet carrier concentration for a given ex-situ annealing temperature. It is believed that nitrogen vacancies need to be created in the AlGaN layer in order to form an electron gas with a high sheet electron density, and reducing the nitrogen pressure used for the ex-situ anneal will lead to more vacancies. It is expected that an electron gas with a sheet electron density of $6 \times 10^{13}$ cm$^{-2}$ or above can be obtained for ex-situ annealing temperatures below 1100° C. reducing the nitrogen pressure used for the ex-situ anneal.

In the method of the invention, the nitride semiconductor layer (i.e., the $Al_yGa_{1-y}N$ layer 26 in the embodiment of FIG. 6) preferably has a thickness of more than 5 nm but less than 50 nm. The $In_xGa_{1-x}N$ layer 27 preferably has a thickness of more than 20 nm but less than 3 μm. These thickness ranges have been found to be suitable for obtaining an electron gas with a high sheet electron concentration. An electron gas is unlikely to be obtained if the thickness of the nitride semiconductor layer is significantly outside the range of 5 nm to 50 nm, and the InGaN layer 27 is unlikely to be able to confine the electron gas effectively if it has a thickness significantly less than 20 nm. The thickness of the nitride semiconductor layer determines whether the electron gas is a 2-dimensional or a 3-dimensional electron gas—a 3-dimensional electron gas is more likely if the nitride semiconductor layer has a thickness of more than about 20 nm, whereas a 2-dimnsional electron gas is more likely if the nitride semiconductor layer has a thickness of less than about 20 nm.

In the method of the invention, the $Al_yGa_{1-y}N$ layer 26 preferably has an Al mole fraction y of 0.3 or less. Use of an AlGaN layer with such a low aluminium mole fraction will still allow generation of an electron gas with a sheet carrier concentration of $6 \times 10^{13}$ cm$^{-2}$ or greater according to the method of the invention, but will avoid the disadvantages associated with use of an AlN layer or an AlGaN layer with a high aluminium mole fraction so that a good quality device may still be obtained. In particular, an AlGaN layer having an aluminium mole fraction of up to 0.3 will not lead to the generation of significant strain within the device, to the formation of significant numbers of dislocations, nor to significant incorporation of unwanted impurities.

The $In_xGa_{1-x}N$ layer 27 and the $Al_yGa_{1-y}N$ layer 26 of the layer structure of FIG. 6 may be not intentionally doped. The method of the invention does not rely on doping the layers, and the method of the invention can obtain an electron gas with a high sheet electron concentration if the $In_xGa_{1-x}N$ layer 27 and the $Al_yGa_{1-y}N$ layer 26 of the layer structure of FIG. 6 are both nominally undoped. This is an advantage particularly when the layer structure of FIG. 6 is incorporated into an electronic or optoelectronic device structure, since providing a highly-doped layer within a device structure can degrade the performance of the device owing to unwanted diffusion of dopants into other layers of the device.

Nevertheless, one or both of the $In_xGa_{1-x}N$ layer 27 and the $Al_yGa_{1-y}N$ layer 26 of the layer structure of FIG. 6 may be intentionally doped if desired. If it desired to dope one or both of the $In_xGa_{1-x}N$ layer 27 and the $Al_yGa_{1-y}N$ layer 26 to be n-type, one suitable dopant is silicon. For example, if a thick GaN layer is would have a high electrical resistance if it were undoped, and incorporating a thick undoped GaN layer in a device structure would lead to a device with a high resistance. It may therefore be preferable to dope the GaN layer in order to reduce its resistance.

In the example of FIG. 6 the aluminium-containing nitride semiconductor layer is a layer of AlGaN. The invention is not limited to this, and the aluminium-containing nitride semiconductor layer may, for example, be a layer of $Al_yGa_zIn_{1-y-z}N$ ($0<y\leq1$, $0\leq z\leq1$) layer. The aluminium mole fraction, y, is preferably less than 0.3.

As stated above, the growth temperature for the InGaN layer 27 and the aluminium-containing nitride semiconductor layer 26 is preferably at least 500° C. A growth temperature of 500° C. is the lower temperature limit for MBE growth of materials such as InGaN and AlGaN, and layers grown at growth temperatures lower than 500° C. are unlikely to have good material quality.

A temperature of 1050° C. is the approximate upper temperature limit for MOCVD growth of AlGaN. Thus, use of a growth temperature within the range from approximately 500° C. to approximately 1050° C. for the layers 26, 27 of the layer structure of FIG. 6 should provide good material quality regardless of the growth technique used. The exception to this is that a temperature of 850° C. is the approximate upper temperature limit for growth of indium-containing materials such as InGaN or AlGaInN, owing to the difficulty of incorporating indium into the material at temperatures significantly greater than 850° C. For growth of an indium-containing layer, for example if the layer 27 is an InGaN layer or if the aluminium-containing nitride layer 26 is an AlGaInN layer, use of a growth temperature within the range from approximately 500° C. to approximately 850° C. should provide good material quality regardless of the growth technique used.

Moreover, a growth temperature for the aluminium-containing nitride layer that is in the range of 550°-700° C. is preferred. This is the temperature range that has been found to lead to an electron gas with the highest sheet carrier concentration. It is proposed that this is due to the formation of nitrogen vacancies during growth at this temperature—in this temperature range, ammonia conversion into atomic nitrogen is poor, hence atomic nitrogen available for growth is low.

Figure 7:
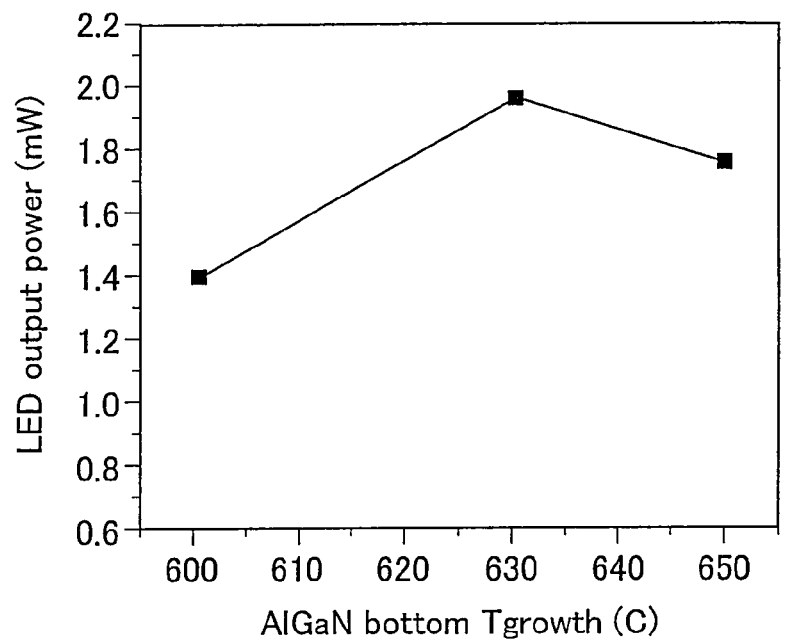
FIG. 7 shows the optical output power of an LED having the general structure shown in FIG. 4 as a function of the growth temperature of the lower AlGaN barrier layer.

FIG. 7 shows the optical output power of an LED having the general structure shown in FIG. 4 as a function of the growth temperature of the lower AlGaN barrier layer 15. It can be seen that all three growth temperatures used (600° C., 630° C. and 650° C.) for the lower AlGaN barrier layer 15 provide a high optical output power, with the growth temperature of 630° C. giving the LED with the highest optical output power. This indicates that an electron gas with a high sheet carrier concentration was formed all three growth temperatures, and that the growth temperature, for the lower AlGaN barrier layer 15, of 630° C. gave the highest sheet carrier concentration for the electron gas.

The annealing temperature that provides the highest sheet carrier concentration has been found to depend on the thickness of the aluminium-containing nitride layer. It is proposed that this is due to a combination of layer re-crystallisation and the formation of surface nitrogen vacancies occurs. For the typical thicknesses mentioned in the application for the aluminium-containing nitride layer, a range of 850° C. to 950° C. for the annealing temperature has been found to provide the highest sheet carrier concentration.

Figure 8:
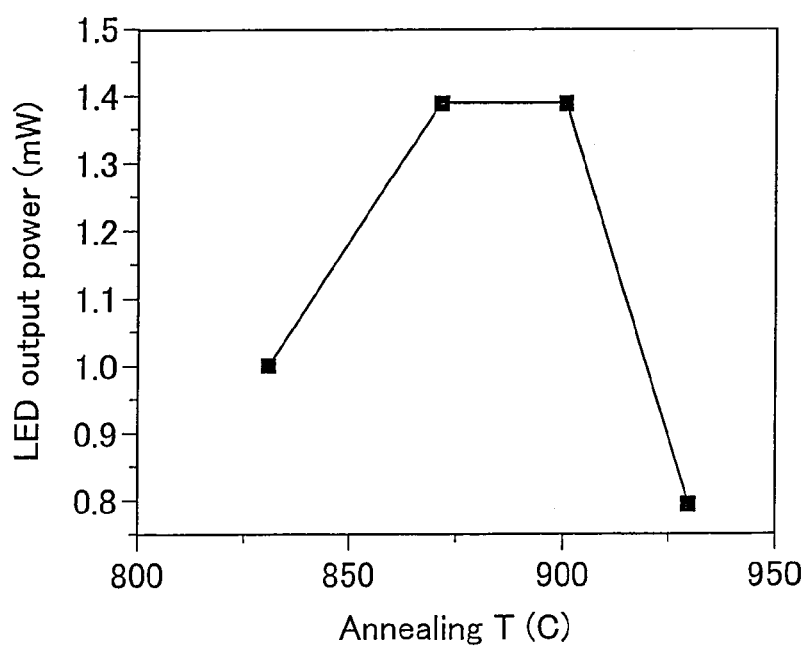
FIG. 8 shows the optical output power of an LED having the general structure shown in FIG. 4 as a function of the annealing temperature.

FIG. 8 shows the optical output power of an LED having the general structure shown in FIG. 4 as a function of the annealing temperature. It can be seen that annealing temperatures in the range from 825° C. to 925° C. provide a high optical output power, with the highest optical output power being obtained at annealing temperatures of 870° C. to 900° C. This indicates that an electron gas with a high sheet carrier concentration was formed at all annealing temperatures of FIG. 8, and that an annealing temperature in the range from 870° C. to 900° C. gave the highest sheet carrier concentration for the electron gas.

The results of FIGS. 7 and 8 were obtained using the structure and growth conditions described above for the first entry in table 1, with the growth temperature of the AlGaN layer or the annealing temperature varied as shown in the figures.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A semiconductor light-emitting device fabricated in a nitride material system and comprising: an active region for light emission and an electron gas region disposed on the n-type side of the active region; wherein the electron gas region contains, in use, an electron gas having a sheet electron density of at least $6 \times 10^{13}$ cm$^{-2}$.

2. A device as claimed in claim 1 wherein the device comprises a first layer disposed on the n-type side of the active region and a second layer forming part of the active region of the device and disposed adjacent to the first layer, the second layer having a different composition from the first layer whereby the electron gas region is defined at the interface between the first layer and the second layer.

3. A device as claimed in claim 2 wherein the first layer is disposed immediately adjacent to the second layer.

4. A device as claimed in claim 2, wherein the first layer is a GaN layer.

5. A device as claimed in claim 2, wherein the first layer is an InGaN layer.

6. A device as claimed in claim 2, wherein the second layer is an aluminium-containing nitride layer.

7. A device as claimed in claim 6 wherein the second layer is an AlGaN layer.

8. A device as claimed in claim 2, wherein the first layer is not intentionally doped.

9. A device as claimed in claim 2, wherein the first layer is doped n-type.

10. A device as claimed in claim 2, wherein the second layer is not intentionally doped.

11. A device as claimed in claim 2, wherein the second layer is doped n-type.

12. A device as claimed in claim 1 wherein the electron gas region contains, in use, a 2-dimensional electron gas.

13. A device as claimed in claim 1 wherein the electron gas region contains, in use, a 3-dimensional electron gas.

14. A device as claimed in claim 1 wherein the device is a light-emitting diode.

15. A device as claimed in claim 1 wherein the device is a semiconductor laser device.

16. A method as claimed in claim 1, wherein the electron gas region is disposed outside the active region.

* * * * *